United States Patent
Watanabe et al.

[11] Patent Number: 6,158,383
[45] Date of Patent: Dec. 12, 2000

[54] PLASMA PROCESSING METHOD AND APPARATUS

[75] Inventors: Seiichi Watanabe; Muneo Furuse; Hitoshi Tamura, all of Kudamatsu; Toru Otsubo, Fujisawa, all of Japan

[73] Assignee: Hitachi, Ltd., Tokyo, Japan

[21] Appl. No.: 09/283,987

[22] Filed: Apr. 2, 1999

Related U.S. Application Data

[63] Continuation of application No. 08/802,910, Feb. 20, 1997, abandoned.

[30] Foreign Application Priority Data

Feb. 20, 1919 [JP] Japan .................................. 8-031665
Apr. 1, 1996 [JP] Japan .................................. 8-078934

[51] Int. Cl.$^7$ .............................. C23C 14/00; H05A 1/24
[52] U.S. Cl. ........................... 118/723 AN; 118/723 ME; 427/562; 427/575; 216/69
[58] Field of Search ...................... 427/575, 562; 216/69, 70; 118/723 AN, 723 ME

[56] References Cited

U.S. PATENT DOCUMENTS

| | | | |
|---|---|---|---|
| 4,872,020 | 10/1989 | Ajioka | 343/771 |
| 5,134,965 | 8/1992 | Tokuda et al. | 118/723 |
| 5,234,526 | 8/1993 | Chen et al. | 118/723 |
| 5,311,103 | 5/1994 | Asmussen et al. | 315/111.18 |
| 5,531,862 | 7/1996 | Otsubo et al. | 156/345 |
| 5,779,802 | 7/1998 | Borghs et al. | 118/723 MP |
| 5,838,111 | 11/1998 | Hayashi et al. | 118/723 AN |

*Primary Examiner*—Marianne Padgett
*Attorney, Agent, or Firm*—Antonelli, Terry, Stout & Kraus, LLP

[57] ABSTRACT

In a plasma processing method and apparatus, microwaves are radiated from a slot antenna set at the bottom of a resonator, a plasma is generated using the microwave and a sample is processed by the plasma. A plasma having a ring-form is generated by the microwaves radiated from the slot antennas, which are disposed at an angle which is neither in parallel to nor perpendicular to a surface current flowing on a slot antenna plate. Thereby, the sample is uniformly processed.

8 Claims, 13 Drawing Sheets

6,158,383

PLASMA PROCESSING METHOD AND APPARATUS

CROSS REFERENCE TO RELATED APPLICATION

This is a continuation of U.S. application Ser. No. 08/802,910, filed Feb. 20, 1997, now abandoned, the subject matter of which is incorporated by reference herein.

BACKGROUND OF THE INVENTION

The present invention relates to a plasma processing method and apparatus. More particularly, the invention relates to a plasma processing method and apparatus for generating a plasma using microwaves to subject a substrate to be treated, such as a wafer, to a plasma processing, such as an etching or filming treatment.

As an example of a microwave plasma processing apparatus of the prior art, there is an apparatus using a cavity resonator and a slot antenna arranged at a right angle with respect to a surface current flowing through the bottom of the cavity resonator, as disclosed in EP-A-0674334. By making use of a slot antenna, the apparatus is constructed to radiate microwaves from the slot antenna in the same mode as that of the microwaves in the cavity resonator, thereby to generate a plasma.

A conventional apparatus of the slot antenna type, as disclosed in U.S. Pat. No. 4,776,918 and U.S. Pat. No. 5,134,965 for example, is provided with slot antennas which are disposed in contact with or set close to a microwave penetrating window for introducing microwaves into a processing chamber so that the processing chamber can be evacuated.

SUMMARY OF THE INVENTION

In the aforementioned prior art, no consideration has been given to provision of a plasma control combined with the use of microwaves in a plurality of modes, so that only a plasma generated with microwaves in a single mode is available, thus raising a problem in controlling the homogeneity of the plasma.

As the packing density of a semiconductor integrated circuit increases, the size of its substrate or wafer made of a semiconductor material, such as silicon, increases so as to enhance the productivity. It is said that for integrated circuits of the next generation many semiconductor devices have to be formed over a large substrate having a diameter of 12 inches (about 300 mm), and that this large substrate has to be processed to form a uniform film.

However, the above-specified prior art approach has failed to give sufficient consideration to the large diameter of the substrate to be treated.

An object of the present invention is to provide a plasma processing method and apparatus capable of controlling the homogeneity of a plasma easily. And, in the plasma processing using microwaves, an object of the present invention is to provide a plasma processing apparatus capable of subjecting a substrate to be treated to a uniform plasma processing over a radial direction even if the diameter exceeds 12 inches (about 300 mm), and a method for operation of the apparatus.

In order to achieve the above-specified object, a microwave plasma processing apparatus has a processing chamber connected to an evacuator so that its inside can be evacuated; a gas supplier for supplying a gas into said processing chamber; and plasma generating means for generating a plasma in said processing chamber by use of microwaves radiated from slot antennas, wherein said slot antennas are disposed at an angle which is neither in parallel with nor perpendicular to a surface current flowing on the wall face equipped with said slot antennas. And, microwaves in a mode $TM_{01}$ are introduced into a cavity resonator to excite the microwaves in a mode $TM_{0mn}$ (wherein m and n are positive integers) in the cavity resonator, and the microwave electric field is radiated from the slot antenna arranged in a ring shape at an angle which is neither in parallel with nor perpendicular to the direction of a surface current flowing through the bottom of the cavity resonator. By introducing the microwaves in the mode $TM_{01}$ into the cavity resonator from above, the microwaves in the mode $TM_{0mn}$ (wherein m and n are positive integers) can be easily excited in the cavity resonator. The surface current flows radially, i.e., in the radial directions, on the wall face of the bottom of that cavity resonator. If the slot antenna is arranged in a ring shape and at a predetermined angle which is neither in parallel with nor perpendicular to the direction of the surface current, the microwave electric field is radiated radially and circumferentially from the slot antenna. In other words, microwaves are radiated in which are mixed both the mode $TE_{0n}$ and the mode $TM_{0mn}$ (wherein m and n are positive integers). By choosing the intersecting angle between the slot antenna and the surface current, therefore, the ratio between the mode $TE_{0n}$ and the mode $TM_{0m}$ (wherein m and n are positive integers) can be optimized, and the uniformity of the microwave plasma to be generated can be easily controlled.

DESCRIPTION OF THE PREFERRED EMBODIMENTS

One embodiment of the present invention will be described with reference to FIGS. 1 to 6.

Figure 1:
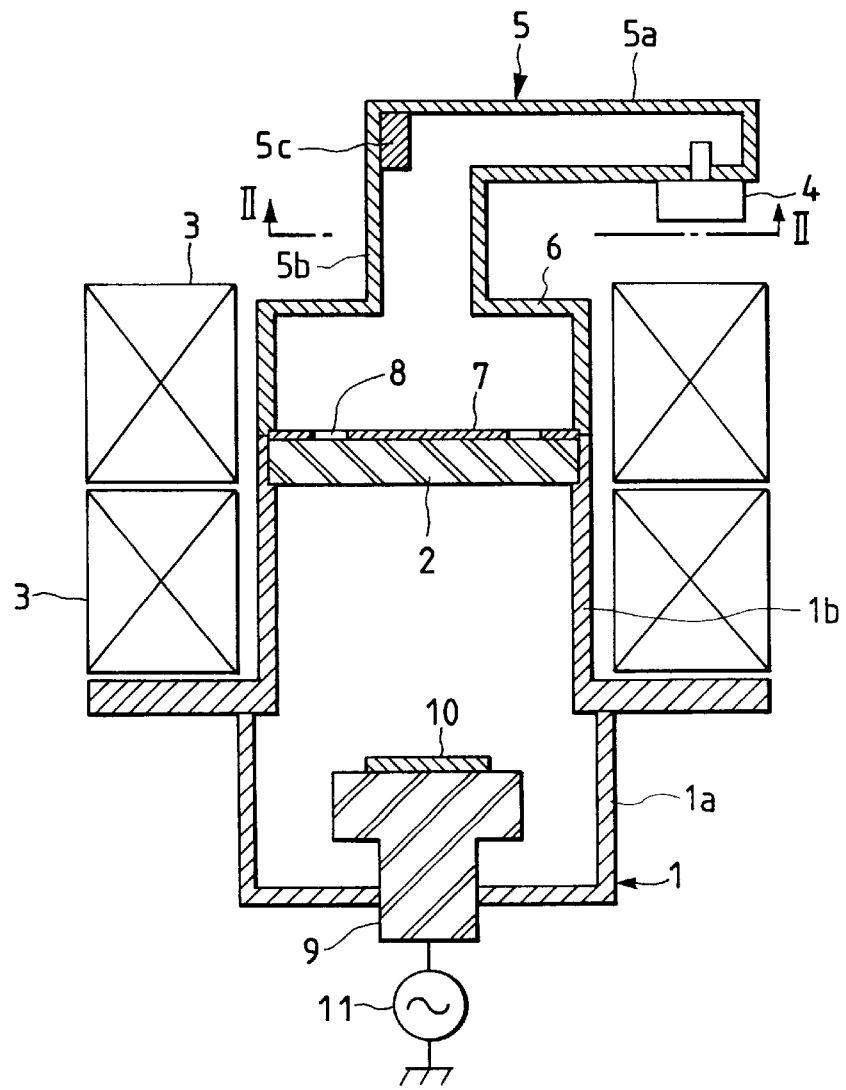
FIG. 1 is a vertical cross section showing a magnetic field microwave dry-etching apparatus according to one embodiment of the microwave plasma processing apparatus of the present invention.

FIG. 1 shows a magnetic field microwave dry-etching apparatus according to one embodiment of a plasma processing apparatus of the present invention. Reference numeral 1 designates a processing chamber which is formed by a container 1a, a discharge tube 1b disposed above the container 1a, and a quartz window 2 fitted in the upper opening of the discharge tube 1b. The processing chamber 1 thus constructed can maintain a gas-tight condition. Numeral 3 designates a coil wound on the outer side of the discharge tube 1b. Numeral 4 designates a magnetron for generating microwaves. Numeral 5 designates a waveguide for transmitting the microwaves from the magnetron 4. In this case, the waveguide 5 is constructed to include a rectangular waveguide 5a equipped with the magnetron 4 at its one end for transmitting the microwaves in a rectangular mode $TE_{10}$ a circular waveguide 5b connected at a right angle to the other end of the rectangular waveguide 5a for transmitting the microwaves in a circular mode $TM_{01}$, and a short-circuit plate 5c disposed at the other end of the rectangular waveguide 5a for converting the transmission mode of the microwaves to be transmitted from the square waveguide tube 5a to the circular waveguide 5b. Numeral 6 designates a resonator which is connected to the other end of the circular waveguide 5b for resonating the microwaves in a mode $TM_{011}$. Numeral 7 designates a slot antenna plate forming the bottom of the resonator 6 and having slot antenna holes 8. Numeral 9 designates a sample bed which extends through the bottom portion of the container 1a while being electrically isolated, and is arranged to support a wafer 10 thereon in the processing chamber 1. Numeral 11 designates a high-frequency power source connected to the sample bed 9.

In the apparatus thus constructed, the inside of the processing chamber 1, as defined by the container 1a, the discharge tube 1b and the quartz window 2, is evacuated by an evacuator (not-shown) and is then supplied with an etching gas to a desired pressure by a gas supplier (not-shown). Moreover, the processing chamber 1 is placed in the magnetic field which is established by the coil 3. The microwaves of 2.45 GHz in this case, as generated by the magnetron 4, are transmitted in the waveguide 5, i.e., in the rectangular waveguide 5a and the circular waveguide 5b, and are introduced into the resonator 6. The resonator 6 is equipped at its bottom with the slot antenna plate 7. The microwaves, as radiated from the slot antenna plate 7, establish a predetermined mode while being transmitted in the quartz window 2, until they are guided through the quartz window 2 into the processing chamber 1. In this case, the quartz window 2 is thickened. Specifically, the plate thickness is set to about 25 mm, and the distance between the slot antenna and the plasma interface is at least a quarter of the wavelength of the microwaves in the medium. Thanks to this distance, the microwaves, radiated from the slot antenna plate 7, establish a constant mode while propagating in the quartz window 2 so that they can be introduced into the plasma, i.e., the processing chamber 1. The wafer 10, as arranged on the sample bed 9, is etched with the plasma which is produced by those microwaves. In order to control the etching shape of the wafer 10, moreover, a bias voltage can be applied to the sample bed 9 by connecting the high-frequency power source 11 with the sample bed 9 through the (not-shown) matching device to supply the high-frequency voltage.

Figure 2:
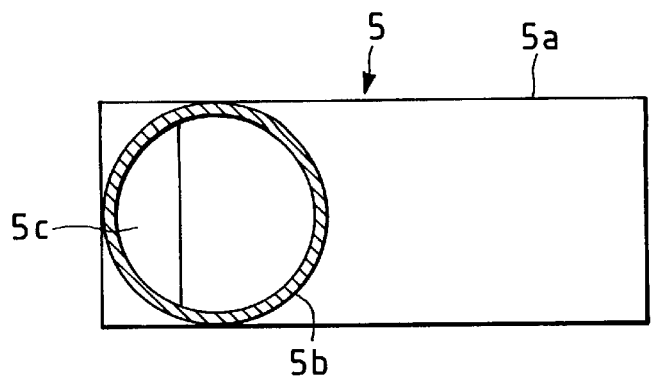
FIG. 2 is a section taken in the direction II—II of FIG. 1.

In the present embodiment, a mode converter, i.e., a short-circuit plate 5c made of a conducting rectangular prism of the same size as the section of the rectangular waveguide, is placed at the junction between the rectangular waveguide tube 5a and the circular waveguide tube 5b, as shown in FIG. 2, and the microwaves are converted from the rectangular mode $TE_{10}$ to be transmitted in the rectangular waveguide 5a into the circular mode $TM_{01}$, so that the microwaves in the mode $TM_{01}$ may be transmitted into the circular waveguide 5b. By introducing the microwaves in the mode $TM_{011}$ into the resonator 6, there is achieved an effect that the mode $TM_{011}$ can be easily excited in the resonator.

Moreover, the entire waveguide 5 for transforming the mode of the microwaves and for transmitting them and the resonator 6 are constructed of hollow waveguides so that microwaves of high output can be introduced without any abnormal discharge in the waveguide passage.

Figure 3:
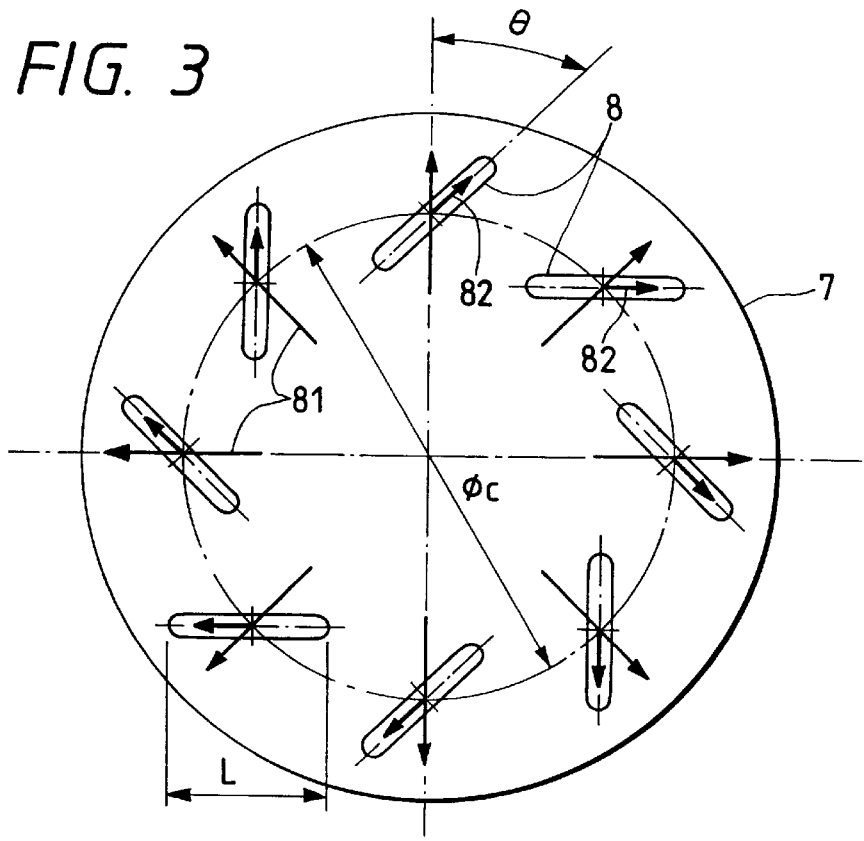
FIG. 3 is a top plan view showing the shape of the slot antennas of FIG. 1.

In the bottom of the resonator 6 in the mode $TM_{011}$, a surface current 81 flows radially from the center to establish a radiating electric field, as shown in FIG. 3. When, when the elongated slot antenna holes 8 are arranged with the slots perpendicular to the radial surface current, the direction of the shortest distance of the slot antenna holes 8 is aligned with the direction of the radial electric field so that the microwave electric field is oriented in the same direction as that of the surface current in the slot antenna holes 8. As a result, the microwaves having the surface current in the same direction as that of the microwaves in the mode $TM_{01}$ as resonated in the resonator 6, are radiated into the quartz window 2 so that the microwaves in the mode $TM_{01}$ are generated while being transmitted in the quartz window 2. On the other hand, when the elongated slot antenna holes are arranged with their long dimension in parallel with the surface current, the field to be established in the slot antenna holes in the same direction as that of the surface current is weakened because the distance between the holes is large, so that the microwaves are not substantially radiated into the quartz window 2.

Figure 4:
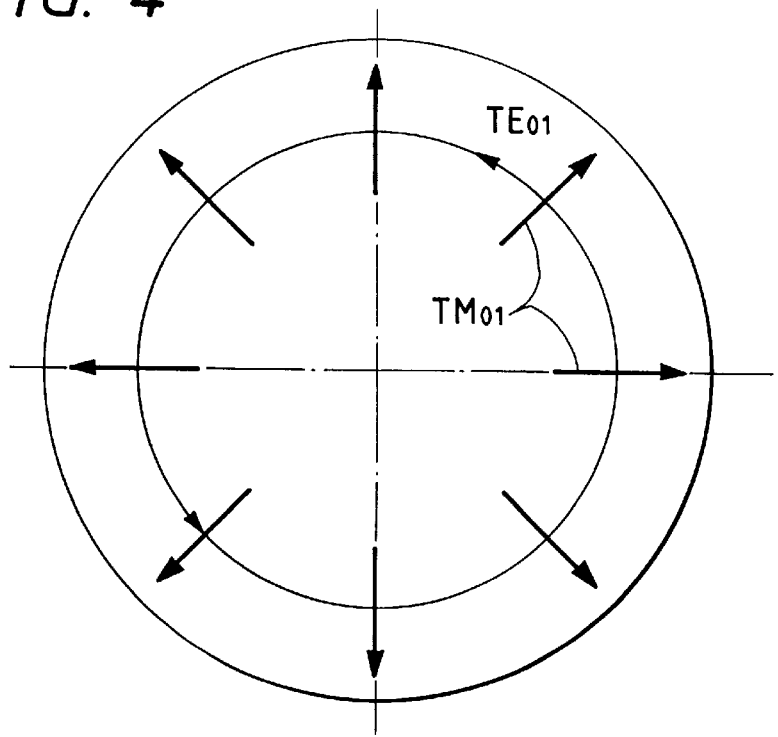
FIG. 4 is a diagram illustrating the microwave magnetic field radiated from the slot antennas illustrated in FIG. 3.
Figure 5:
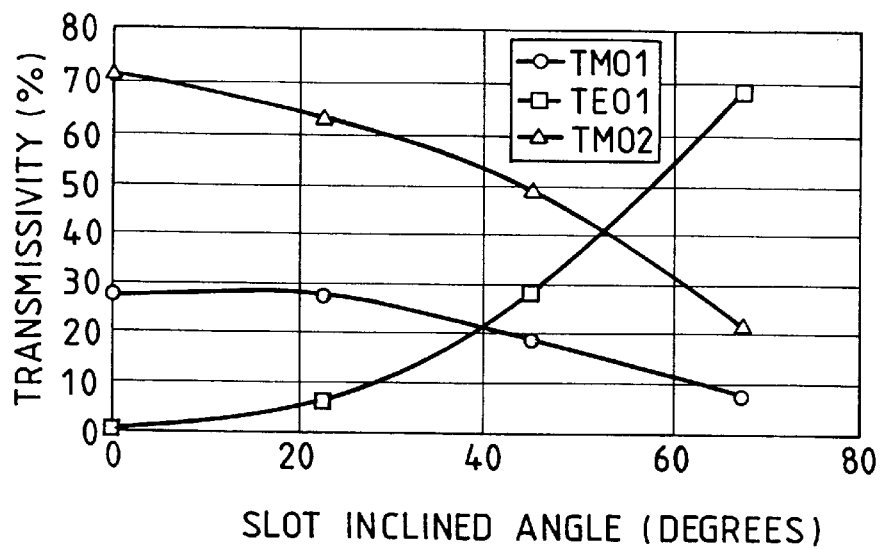
FIG. 5 is a graph plotting the transmissivities of modes when the angle of inclination of the holes in the slot antenna of FIG. 3 is changed.

In the present embodiment, on the contrary, slot antenna holes 8 are arranged at an angle which is neither perpendicular to nor parallel with the surface current 81, as shown in FIG. 3. With this arrangement, an electric field Er in the radial direction and an electric field Eθ in the circumferential direction are established in the slot antenna holes 8 at a ratio according to the angle θ between the slot antenna holes 8 and the surface current. As a result, into the quartz window 2, there are radiated the microwaves of the surface current in which are mixed the mode $TM_{01}$ having a radial electric field and the mode $TE_{01}$ having a electric field in the direction generally at a right angle with respect to the radial direction, as shown in FIG. 4. The microwaves in the mode $TE_{01}$ have the highest field intensity at a portion of about one half of the resonator 6 diameter so that they are efficiently radiated if the ring center diameter φc, in which the slot antenna holes 8 are arranged in the shape of a ring, as shown in FIG. 3, is about one half as large as the internal diameter of the resonator 6. If the direction 82 of the slot antenna holes 8 and direction of the surface current 81 make an angle θ of 45 degrees and if the ring center diameter φc is about one half as large as the internal diameter of the resonator 6, the microwaves in the mode $TM_{01}$ and in the mode $TE_{01}$ are radiated generally at a ratio of 1:1 into the quartz window 2. Both the modes $TM_{01}$ and $TE_{01}$ have a field intensity distribution of axial symmetry, and there is achieved an effect that the plasma of axial symmetry distribution can be easily generated if the microwaves having those modes mixed are introduced into the processing chamber 1. Incidentally, FIG. 5 plots the changes in the transmissivity of the microwave modes when the angle θ between the direction of the slot antenna holes 8 and the direction of the surface current 81 is changed.

Figure 6A:
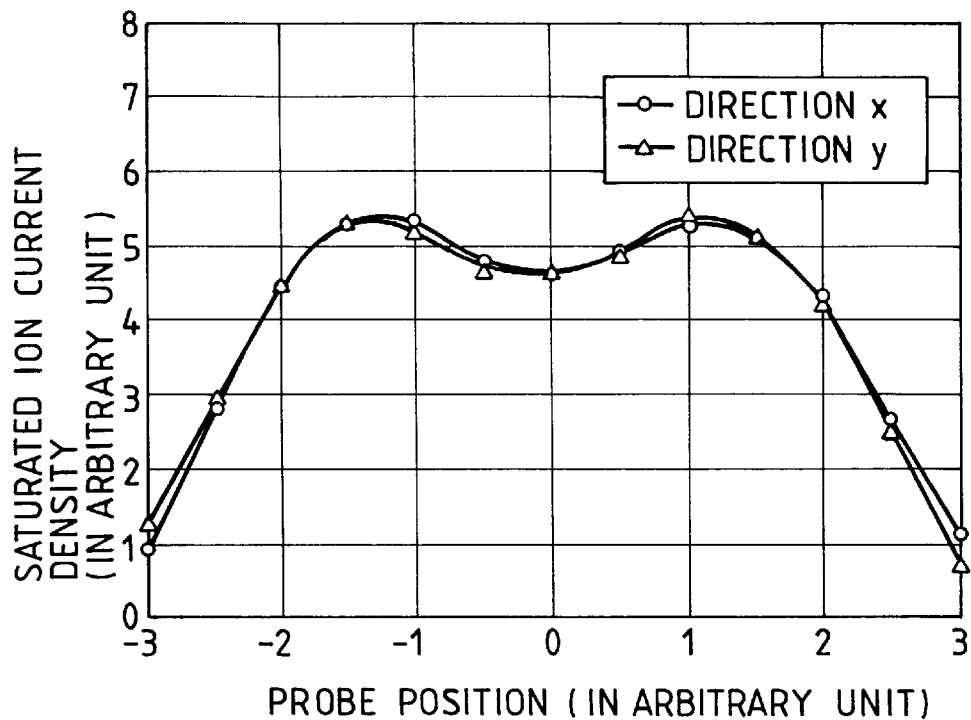
FIG. 6(a) and FIG. 6(b) are graphs plotting the plasma density distributions when the magnetic field by the coil of the apparatus of FIG. 1 is changed.
Figure 6B:
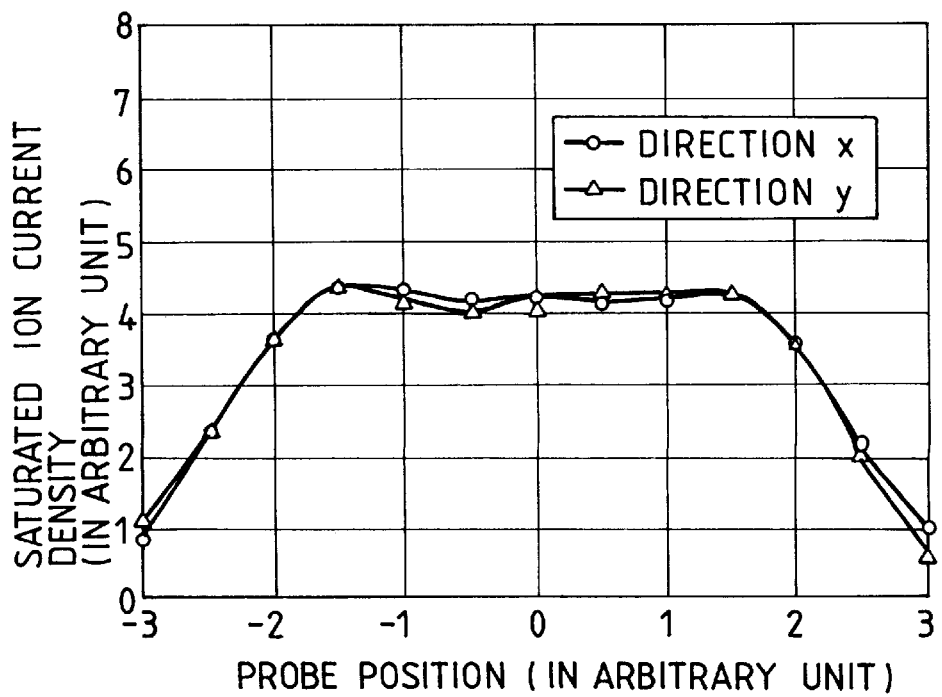

The plasma thus generated is lost to a great extent on the wall face of the processing chamber 1 or the outer circumference, but is hardly lost at all on the center axis of the central portion. By forming the plasma generating region in a ring shape, therefore, it is easy to establish a plasma which is homogeneous over a wide range. The plasma generating region can be formed in a ring shape, as illustrated in FIG. 6(*a*), by introducing microwaves having the mixed modes $TM_{01}$ and $TE_{01}$ into the processing chamber 1, as in the present embodiment, and the ring diameter of the ring-shaped plasma generating region can be changed to control the plasma homogeneity by changing the ratio of the mode $TM_{01}$ and the mode $TE_{01}$. The ratio of the modes $TM_{01}$ and $TE_{01}$ can be changed by changing the angle θ at which the slot antenna holes 8 intersect the surface current 81, as has been described hereinbefore, the shape of the slot antenna holes 8 or the position of the slot antenna holes 8. By adjusting the current or voltage to be fed to the coil 3 wound on the outer circumference of the discharge tube 1*b* (as arranged in two vertical stages in this case), moreover, it is also possible to establish a plasma which is substantially homogeneous over a wide range, as illustrated in FIG. 6(*b*).

The present embodiment has been described for the case in which the mode $TM_{01}$ is excited in the resonator 6. Generally speaking, however, when a mode $TM_{0mn}$ (wherein m and n are positive integers) of higher order is excited in the resonator 6, microwaves, in which a high mode $TM_{0m}$ (wherein m is a positive integer) and a high mode $TE_{0m}$ (wherein m is a positive integer) are mixed, are radiated according to the arrangement and shape of the slot antenna holes. It is effective, for example, to change the width of the slot antenna holes in the longitudinal direction to achieve a change of the ratio of the various microwave modes.

Figure 7:
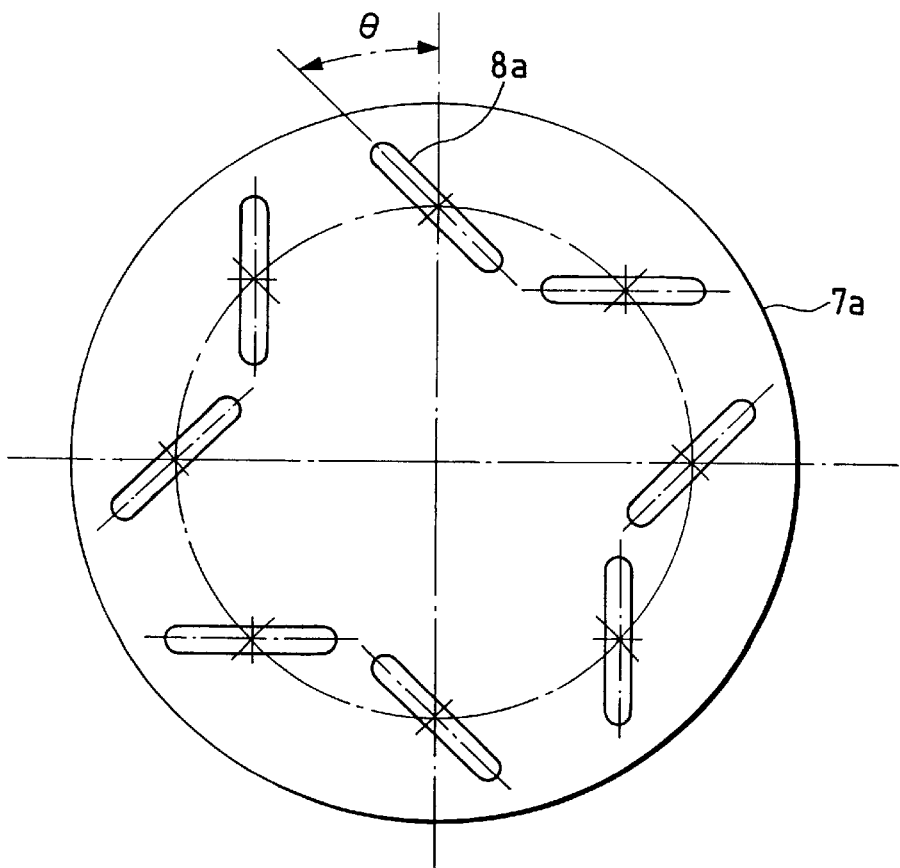
FIG. 7 is a top plan view showing another embodiment of the slot antennas of FIG. 3.

On the other hand, FIG. 7 shows another example of an arrangement of the slot antenna holes 8*a*, in which the direction of the slot antenna holes 8*a* are alternately arranged as shown. By adjusting the angle θ it is possible to adjust the degree of the electromagnetic coupling between the cavity resonator 6 and the discharge tube 1*b*. Specifically, the electromagnetic coupling is weak when the absolute value of the angle θ is near 0 degrees, but it is strong when it is near 90 degrees. If the electromagnetic coupling is excessively strong, the degree by which the electromagnetic field in the cavity resonator deviates from the desired electromagnetic field increases. If the electromagnetic coupling is excessively weak, on the other hand, the electromagnetic waves are hardly radiated at all into the processing chamber. This makes it necessary to optimize the coupling degree so that this optimum coupling degree can be easily achieved by adjusting the angle θ. However, when the slot antenna holes 8*a* are arranged in the cavity resonator 6 in the circular $TM_{011}$ mode, the components in the angular direction (i.e., the direction q), as radiated from the adjoining slots, are offset (or canceled) so as to leave only the radial component, thereby forming a microwave power distribution having a recessed center. In any event, this method of constructing the slot antenna is not restricted to the present embodiment, but can be likewise applied to the case in which another cavity resonator of a following type is used.

On the other hand, the thickness of the conductor plate (slot antenna plate 7, 7*a*) to be equipped with the slot antenna holes 8, 8*a* for electromagnetic coupling usually is as small as 1 mm to 5 mm, but could be exemplified by a thick plate of about 5 mm or more. When this thick conductor plate is used, the portions of the coupling holes act as a waveguide in the thickness direction so that the degree of freedom for the shape of the coupling holes is lower than that for the thin construction. If the longer side of a rectangular waveguide is smaller than one half of the wavelength of the microwaves (or the electromagnetic waves) in the free space, the electromagnetic field will not propagate in the axial direction of the waveguide tube, but will attenuate according to an exponential function. When the thick conductor plate is used, therefore, it is necessary to make the length of the slot antenna holes or the coupling holes in the longitudinal direction larger than a half wavelength. When the microwaves have a frequency of 2.45 GHz, the wavelength in the free space is 122.4 mm so that the length of the longitudinal slot antenna hole axis has to be larger than 61.2 mm. When the thick slot antenna plate is used, however, a coolant can be circulated to cool down the inside of the slot plate.

Figure 8:
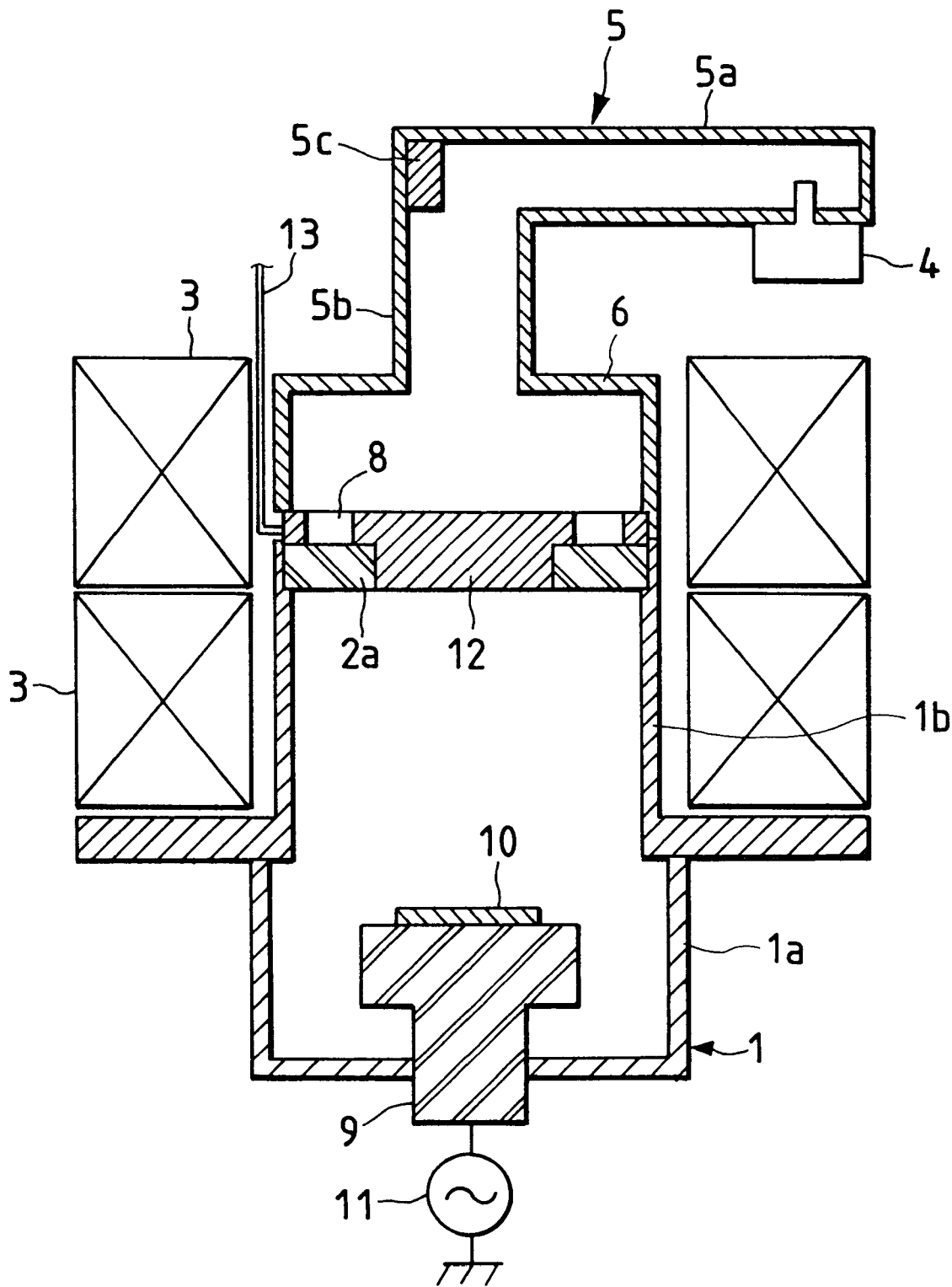
FIG. 8 is a vertical cross section showing a magnetic field microwave dry-etching apparatus according to a second embodiment of the plasma processing apparatus of the present invention.
Figure 9:
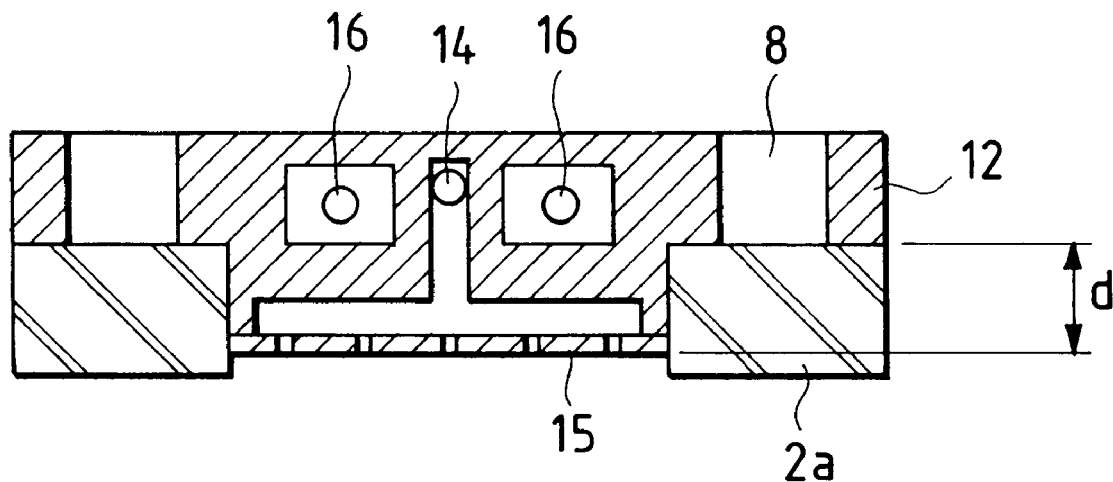
FIG. 9 is a vertical cross section showing the detail of an electrode, as opposed to a wafer, in the apparatus of FIG. 8.

A second embodiment of the present invention will be described with reference to FIGS. 8 and 9. The same reference numerals are used in FIGS. 8 and 9 as those of FIG. 1 to designate common members, and their description will be omitted. The difference between FIGS. 8 and 9 and the aforementioned embodiment of FIG. 1 resides in that the quartz window is a ring shape, in that the center portion of the slot antenna plate faces the processing chamber 1, and in that the slot antenna plate is provided as a grounded electrode 12 disposed in opposition to the wafer 10. By these features, it is possible to improve the homogeneity of the high-frequency voltage to be applied to the wafer 10, in the plane of the wafer 10. As a result, the energy of the ions to be introduced into the wafer 10 is uniform in the plane of the wafer 10, thus providing an effect that a homogeneous etching treatment can be ensured. The electrode 12 is so constructed that it can control the temperature and feed a gas through a supply line 13 for the gas, a coolant and electric power. The structure of the electrode 12 is shown in more detail in FIG. 9. In FIG. 9, the etching gas is introduced from a gas feed port 14 and is distributed into the processing chamber 1 through a distribution plate 15. The gas can be easily fed from above the wafer 10, and the radicals, as produced by the plasma, can be efficiently conveyed to the wafer 10, thereby to provide an effect to improve the etching rate and the etching homogeneity. Moreover, the coolant, the temperature of which is controlled by a chiller unit (not-shown), flows in the electrode 12 through a coolant feed/discharge port 16 so that it can control the temperature of the electrode 12. As a result, the deposition rate of the plasma overlapped film deposited on the electrode 12 can be controlled to control the radical composition in the plasma, thus providing an effect to prevent aging of the etching characteristics finally. The electrode 12 protrudes at its center to match the shape of the microwave introduction window 2a, but this protrusion by an amount d, as shown in FIG. 9, is arbitrary. If this protrusion amount d is adjusted to adjust the area ratio between the bottom and the side of the microwave introduction window 2a, the direction and the amount of the radiation of the microwave power can be controlled. Moreover, the electrode 12 will not be electrically grounded to supply a high frequency.

Figure 10:
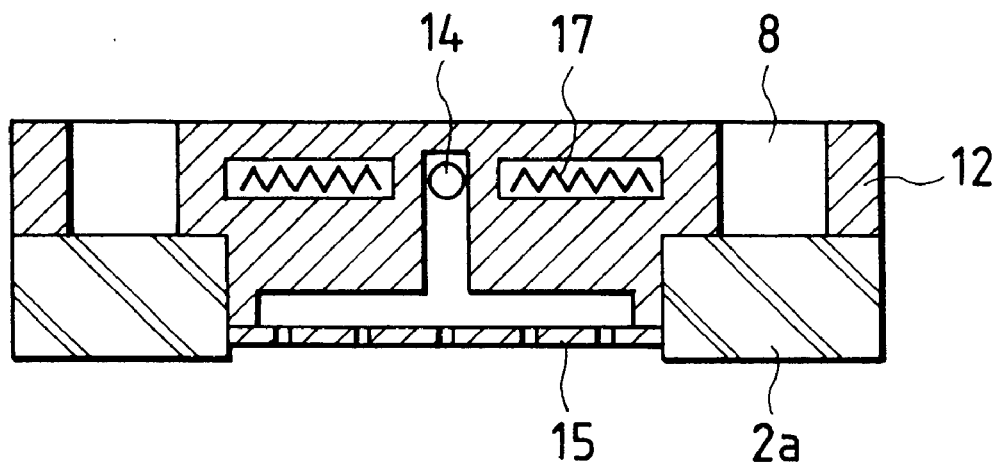
FIG. 10 is a vertical cross section showing another embodiment of the electrode of FIG. 9.

On the other hand, FIG. 10 shows another embodiment of the electrode 12 shown in FIG. 9. In this embodiment, a heater 17 is embedded in the electrode 12, which can be heated to 100 or higher to easily reduce or prevent the deposition of the plasma overlapped film thereon. In this case, it is possible to suppress the production of dust which might otherwise be caused by the separation or the like of the plasma overlapped film, as deposited on the electrode. Finally, there is achieved an effect to improve the yield of the semiconductor element.

By changing the angle at which the surface current, which flows on the slot antenna plate of the bottom face of the cavity resonator for introducing the microwaves, and the slot antenna disposed on the bottom face intersect, according to the first and second embodiments, the ratio of the modes of the various microwaves to be radiated from the slot antenna can be changed to provide an effect that the homogeneity of the microwave plasma to be generated can be easily controlled.

A third embodiment of the present invention will be described with reference to FIGS. 11 and 12. When a plasma exists in a closed space, it is lost on the wall face of the discharge tube so that its density distribution has a tendency to be high at the center of the space and slopes down to the edges. A similar tendency is also evidenced by the plasma to be used in the plasma processing apparatus, which may be one cause for non-uniformity of the plasma processing. In order to eliminate this problem, it is conceivable to set the amount of plasma so as to increase the amount of the plasma in the vicinity of the wall face. When the substrate 32 to be treated has a disc shape, it is natural to use the plasma processing chamber 21 having a cylindrical shape. In this case, the plasma loss on the cylinder side wall exerts influences upon the uniformity in the substrate to be plasma processed. In order to reduce the plasma non-uniformity in the vicinity of the substrate due to the distribution of the amount of generated plasma, it is necessary to adjust the plasma distribution into a ring shape, so that the plasma is high in the vicinity of the side walls and low at the center. When a square processing chamber is used, it is also necessary to adjust the ring-shaped plasma distribution to be high in the vicinity of the processing chamber wall face and low at the center.

The amount of generated plasma has a positive correlation to the amount of plasma generating energy to be consumed. The consumption rate of the energy for generating the plasma is determined by the ratio between the supply and loss of the energy. In order to adjust the distribution of generated plasma to a ring shape, in which the plasma is high in the vicinity of the side walls and low at the center, therefore, it is important that the distribution of energy to be supplied to the plasma be formed into a ring shape.

Figure 11:
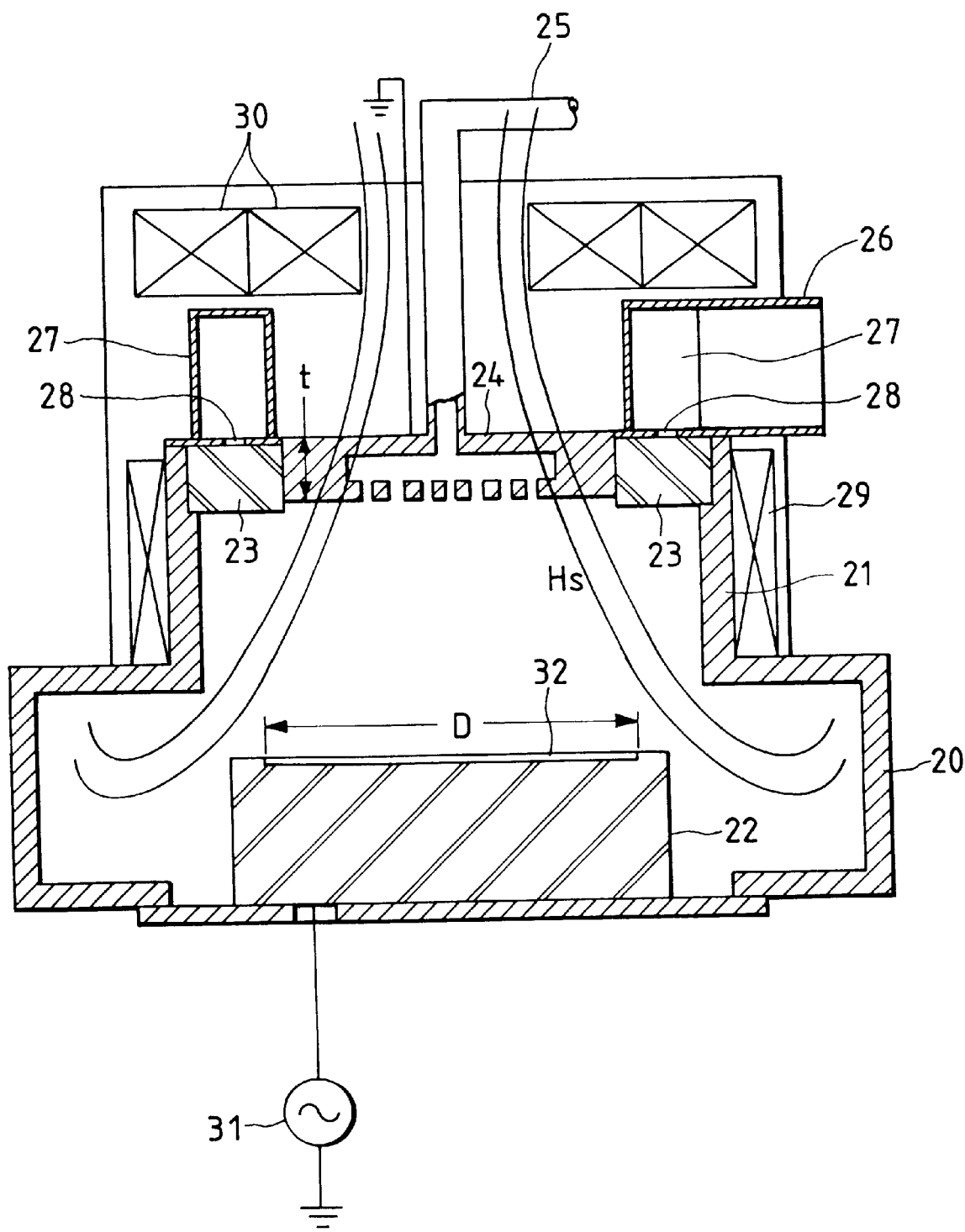
FIG. 11 is a vertical cross section showing a microwave dry-etching apparatus according to a third embodiment of the plasma processing apparatus of the present invention.

FIG. 11 is a section showing an etching apparatus using a ring-shaped cavity resonator according to the present invention. Microwaves are used as the energy source for generating the plasma. For a ring-shaped power distribution, it is possible to use a ring-shaped cavity resonator 27. For microwaves having a wavelength $\lambda$ of about 10 cm in the free space, the electromagnetic field in the cavity resonator 27 has a tendency to produce a distribution in which it exhibits a periodic intensity change in an order of about 10 cm. When the diameter D of the substrate 32 to be treated gradually increases from 10 inches (i.e., about 254 mm) to 12 inches (i.e., about 305 mm), for example, the ring-shaped cavity resonator 27 is also required to have an equal order size. This causes the ring-shaped cavity resonator 27 to be exemplified by one which produces a distribution having several to ten and several peaks in its internal electromagnetic field.

The microwave power, supplied by the microwave generating source (not-shown), is transmitted through a isolator (not shown) and a matching device (not shown) to the ring-shaped cavity resonator 27 by a rectangular waveguide 26. The ring-shaped cavity resonator 27 is provided with a microwave radiating hole 28 to radiate the microwaves to the plasma discharge tube 21 through a microwave introduction window 23. The ring-shaped cavity resonator 27 is made of a material having a high conductivity, such as aluminum or copper, for reducing the loss in microwave power. The microwave introduction window 23 is made of a dielectric material, such as quartz or alumina ceramics, which causes little loss in the microwaves or which is less likely to exert adverse effects upon the plasma processing. On the other hand, the microwave introduction window 23 is formed into a ring shape according to the ring-shaped cavity resonator 27. The plasma is generated in the plasma discharge tube 21 with the microwaves which are radiated from the microwave introduction window 23 into the plasma discharge tube 21.

This microwave introduction window 23 also has a ring shape. The microwaves, as radiated from the cavity resonator 27 through the coupling hole 28, are radiated into the plasma discharge tube 21 from planes parallel to and normal to the center axis of the microwave introduction window 23. If the disc-shaped part 24 is made of a substance having a high conductivity, the microwaves are reflected on the surface of the disc-shaped part 24. By adjusting the thickness t of the disc-shaped part 24, the area to be exposed to the processing chamber in parallel with the center axis of the microwave introduction window 23 can be adjusted to adjust the ratio of the microwave powers to be radiated from the two faces of the microwave introduction window 23. Specifically, if the thickness t of the disc-shaped part 24 is made substantially as large as the thickness of the microwave introduction window 23, a plane in parallel with the center axis of the microwave introduction window 23 can be completely shielded to eliminate the microwave power to be radiated from that plane. By reducing the thickness t of the disc-shaped part 24 to expose the plane in parallel with the center axis more to the plasma discharge tube 21, moreover, it is possible to increase the ratio of radiation of the microwaves from that plane. By controlling the ratio of radiation of the microwave powers from the aforementioned two planes of the microwave introduction window 23, the distribution of the microwave powers in the plasma discharge tube 21 can be adjusted to adjust the distribution of the amount of plasma to be generated.

Specifically, the microwave power to be supplied from the microwave introduction window 23 to the plasma can be optimized by adjusting the thickness t of the microwave introduction window 23. The thickness t of the microwave introduction window 23 is adjusted in a direction to increase or decrease the thickness by several times the half wavelength of the microwaves in accordance with the impedance of the plasma acting as a load, as viewed from the microwave introduction window 23 so that the impedance can be matched to optimize the transmitted power. Thus, it is necessary to optimize the thickness t of the microwave introduction window 23 at the designing stage.

The disc-shaped part 24 is surrounded by the microwave introduction window 23. A processing chamber is constructed to include the vessel 20, the plasma discharge tube 21, the microwave introduction window 23 and the disc-shaped part 24. The processing chamber thus constructed can retain its inside in a gas-tight condition. With this arrangement, the disc-shaped part 24 can be supplied with an electric power, a processing gas or a coolant through the axial portion of the ring-shaped cavity resonator 27. As a result, the disc-shaped part 24 can be heated or cooled to a temperature suitable for the required treatment by the temperature control mechanism (not shown). When the disc-shaped part 24 is to be heated, it can be heated by embedding a heater or the like in the disc-shaped part 24. When this disc-shaped part 24 is to be cooled, it can be cooled by embedding a passage for the coolant, such as water, in the disc-shaped part 24.

Moreover, the plasma discharge tube 21 can be supplied with a predetermined flow rate of one or more kinds of atmospheric gases suitable for the treatment by connecting a gas feed mechanism 25 to the disc-shaped part 24. Moreover, the plasma to be generated can be adjusted by supplying high-frequency power to the disc-shaped part 24. The vessel 20 is controlled at a pressure suitable for the required treatment by connecting the discharge system (not shown) to the processing chamber 21. On the other hand, the disc-shaped part 24 is electrically grounded to earth and can be used as the electrode for grounding the high frequency which is fed by a high frequency power source 31, such as 13.56 MHz, connected through a matching device (not-shown) with the substrate 32 to be treated.

Next, the action of the disc-shaped part 24 as a grounding electrode will be described with reference to FIG. 11. The high-frequency current in the plasma is mainly an electron current which has a small mass and tends to follow the high-frequency electric field. However, if a static magnetic field $H_s$ is supplied by the plurality of static magnetic field generators 29 and 30, the motions of the electrons perpendicular to the static magnetic field are suppressed so that the high-frequency current flow in that direction becomes inhibited. As a result, the high-frequency current flows mainly along the static magnetic field $H_s$. The disc-shaped part 24 is disposed to confront the substrate 32, and the static magnetic field $H_s$ is applied substantially normal to the substrate 32, so that the current to be fed by the high frequency applied to the substrate 32 flows substantially uniformly between the substrate 32 and the disc-shaped part 24. As a result, the rates of the high-frequency current flow at the surrounding areas and in the vicinity of the center are substantially equal even for the substrate 32 having a diameter D of 10 inches (about 254 mm), 12 inches (about 305 mm) or more, so that the influences of the high frequency to be exerted upon the substrate 32 can be made uniform.

In addition, the gas can be supplied uniformly from the disc-shaped part 24 to the processing chamber.

The substrate 32 is a disc-shaped substrate having a diameter of 10 inches (i.e., about 254 mm), 12 inches (i.e., about 305 mm) or more. A plurality of static magnetic field generators 29 and 30 are disposed around the plasma discharge tube 21 so that a static magnetic field $H_s$ having a magnitude sufficient to produce an electron cyclotron resonance phenomenon can be generated in the processing chamber. The static magnetic field $H_s$ is generated substantially in a direction normal to the substrate 32 to be treated. If the microwaves have a frequency f of 2.45 GHz, the magnitude of the static magnetic field $H_s$ for causing the electron cyclotron resonance phenomenon is 0.0875 tesla. If the plurality of static magnetic field generators 29 and 30 are electromagnets, the static magnetic field distribution in the processing chamber can be controlled by adjusting the rate of the current to be fed to the electromagnets, thereby to control the position at which the static magnetic field reaches a magnitude for causing the electron cyclotron resonance. Even if another static magnetic field generator is used, the static magnetic field in the processing chamber can be controlled by adjusting the positional relation between the static magnetic field generator and the processing chamber. Incidentally, in the plasma processing apparatus using the electron cyclotron resonance phenomenon, the microwave power is intensely absorbed in the place where the electron cyclotron resonance occurs so that the plasma is generated mainly in that place. The region for generating the plasma can be controlled by controlling the static magnetic field. On the other hand, the electrons in the plasma are suppressed from moving in a direction perpendicular to the static magnetic field. As a result, the diffusion of the electrons into the plasma can be controlled by adjusting the static magnetic field.

On the other hand, the electron cyclotron resonance phenomenon occurs when the electric field E of the microwaves and the static magnetic field (in the direction z) intersect each other at a right angle. For using the electron cyclotron resonance phenomenon, the TE mode (because the electric field E is generated in the radial direction (i.e., the direction r) of the cavity resonator 27) is more advantageous than the TM mode (because the electric field E is generated in the axial direction (i.e., the direction z) of the cavity resonator 27).

On the other hand, the TM mode is advantageous for reducing the size of the apparatus because it is a mode in which the electromagnetic field does not change in the axial direction (i.e., the direction z), so that the resonator height h can be reduced.

An example of the size of the ring-shaped cavity resonator in the $TE_{m1}$ mode for the frequency of 2.45 GHz of the microwaves is tabulated in the following Table 1:

TABLE 1

| Mode | Inside radius a | Outside radius b | Height h |
|------|-----------------|------------------|----------|
| $TE_{41}$ | 65 mm | 120 mm | 109 mm |
| $TE_{51}$ | 189 mm | 144 mm | 109 mm |
| $TE_{61}$ | 113 mm | 167 mm | 109 mm |
| $TE_{71}$ | 136 mm | 191 mm | 109 mm |
| $TE_{81}$ | 160 mm | 215 mm | 109 mm |

Likewise, an example of the size of the ring-shaped resonator in the $TM_{m1}$ mode for the microwave frequency of 2.45 GHz when the electromagnetic field does not change in the axial direction is tabulated in the following Table 2:

TABLE 2

| Mode | Inside radius a | Outside radius b |
|---|---|---|
| $TM_{51}$ | 63 mm | 172 mm |
| $TM_{61}$ | 86 mm | 195 mm |
| $TM_{71}$ | 110 mm | 219 mm |
| $TM_{81}$ | 133 mm | 242 mm |
| $TM_{91}$ | 157 mm | 266 mm |
| $TM_{31}$ | 85 mm | 155 mm |
| $TM_{41}$ | 125 mm | 195 mm |
| $TM_{51}$ | 165 mm | 235 mm |
| $TM_{61}$ | 206 mm | 276 mm |
| $TM_{71}$ | 246 mm | 316 mm |
| $TM_{81}$ | 286 mm | 356 mm |

Incidentally, when the radiation hole 28 (or coupling hole or slot) for radiating the microwaves is formed in the cavity resonator 27, the electromagnetic waves can be efficiently radiated if the radiation hole 28 is formed in a slot parallel to the microwave magnetic field. For reducing the power loss of the microwaves, the cavity resonator 27 is made of a substance having a high conductivity, the microwave magnetic field H is directed in parallel with the inner face of the cavity resonator 27 and perpendicular to the electric field E. As shown in FIG. 12 (presenting the case of the $TE_{41}$ mode), the angle θ between the magnetic field H and the radiation hole 28 can be adjusted to adjust the electromagnetic field in the cavity resonator 27 and the intensity of the electromagnetic coupling between the microwave introduction window 23 and the plasma discharge tube 21. Thereby, the electromagnetic field in the cavity resonator 27 is kept in the desired mode, and the microwaves can be efficiently radiated into the plasma discharge tube 21.

Another method of adjusting the electromagnetic field in the cavity resonator 27 and the intensity of the electromagnetic coupling between the microwave introduction window 23 and the plasma discharge tube 21 is exemplified by controlling the length of the slot antenna hole. The electromagnetic coupling can be weakened, if the slot antenna hole is shortened, but intensified if it is elongated.

Figure 12:
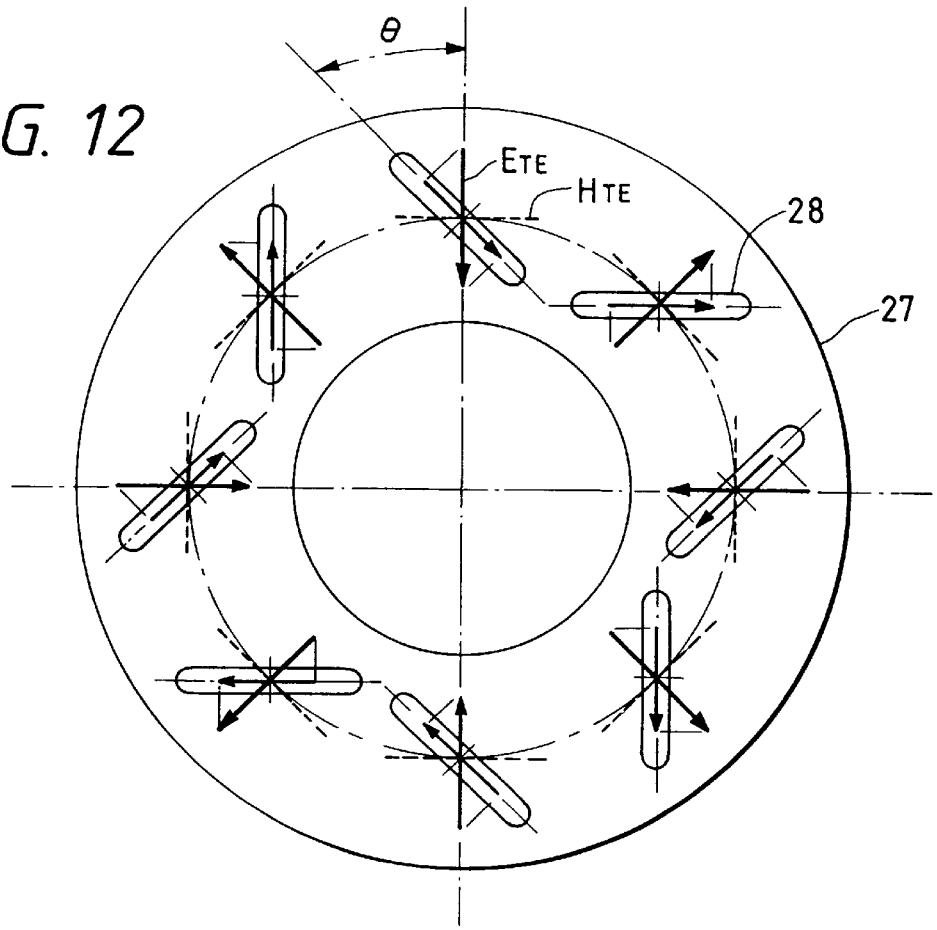
FIG. 12 is a top plan view showing slot antennas formed in the bottom of the ring-shaped cavity resonator, as excited in the TE mode, of FIG. 11.

In the case of the $TE_{m1}$ mode in the ring-shaped cavity resonator 27, as shown in FIG. 12 (presenting the case of the $TE_{41}$ mode), the microwave magnetic field $_{THE}$ has no radial (i.e., in the direction r) component in a plane normal to the center axis. As a result, when the angle θ between the axial direction and the radial direction (i.e., the direction r) of the slot antenna hole acting as the radiation hole 28 is small, the electromagnetic field in the cavity resonator 27 and the electromagnetic coupling between the microwave introduction window 23 and the plasma discharge tube 21 are increased. By forming the slot antenna hole or the radiation hole 28 into the shape as shown, moreover, the radial component of the electromagnetic field of the microwaves, as radiated from the adjacent slot antenna hole, is offset (or canceled), so that an electromagnetic field having an angular component (i.e., in the direction q), that is, composed mainly of the $TE_{0n}$ mode (n=1, 2, 3, - - - ) is radiated through the microwave introduction window 23 into the plasma discharge tube 21. As a result, the plasma to be generated takes a ring shape having a recessed center. Even if the diameter D of the substrate 32 to be treated is 10 inches (about 254 mm), 12 inches (about 305 mm) or more so that the plasma disappears on the processing chamber wall face, it is possible to perform a plasma processing which is uniform in the radial direction of the substrate 32, such as an etching treatment.

Figure 13:
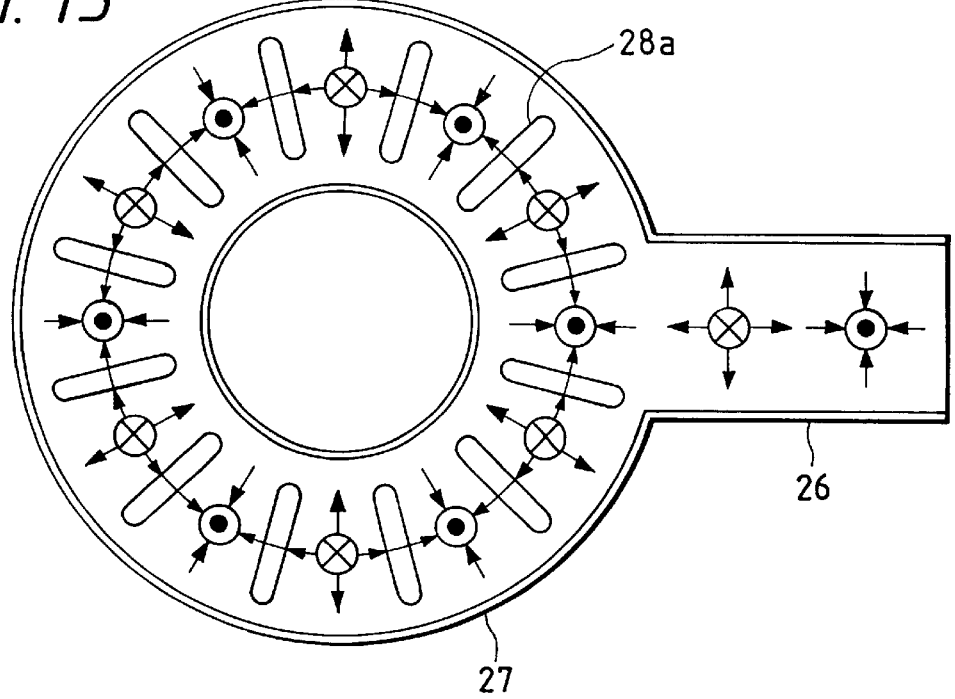
FIG. 13 is a top plan view showing another embodiment of the slot antennas formed in the bottom of the ring-shaped cavity resonator, as excited in the TE mode, of FIG. 11.

The microwave electric field in the case of the $TM_{m1}$ mode in the ring-shaped cavity resonator 27 and the surface current flowing in the bottom of the cavity resonator are schematically shown in FIG. 13 (corresponding to the case of the $TM_{61}$ mode). The microwave electric field $E_{TM}$ has only an axial component (i.e., in the direction z) so that an antinode of the standing wave is formed in the angular direction (i.e., in the direction q). On the other hand, the surface current to flow through the bottom of the cavity resonator 27 flows radially from the center or the location of the antinode of the electric field standing wave. Thus, FIG. 13 (presenting the case of the $TM_{61}$ mode) shows the case in which the slot or the radiation hole 28a between the antinodes of the electric field standing wave is formed perpendicular to the surface current and radially of the center of the cavity resonator 27. The electromagnetic field mainly in the mode $TE_{61}$ is radiated from the radiation hole 28a, as shown in FIG. 13, through the microwave introduction window 23 into the plasma discharge tube 21. As a result, the spots, as formed at the tips of the radiation holes 28a, can merge into each other to generate a ring-shaped plasma having a recessed center.

Figure 14:
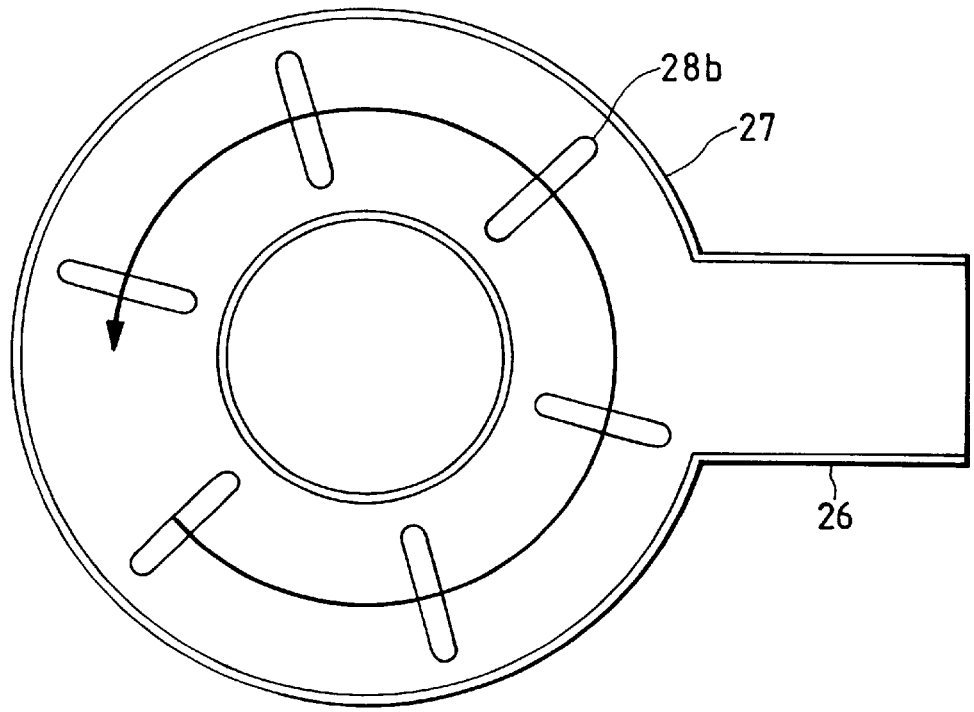
FIG. 14 is a top plan section showing another embodiment of the slot antennas of FIG. 13.

FIG. 14 (presenting the case of the $TM_{61}$ mode) shows the case in which the slot antenna holes 28a are alternately formed. In this case, the electromagnetic field mainly in the $TE_{0n}$ mode (n=1, 2, 3, - - - ) is radiated from the slot antenna holes 28a through the microwave introduction window 23 into the plasma discharge tube 21 so that a ring-shaped plasma having a recessed center is generated. Even if the diameter D of the substrate 32 to be treated is 10 inches (about 254 mm), 12 inches (about 305 mm) or more, so that the plasma disappears on the processing chamber wall face, it is possible to perform a plasma processing which is uniform in the radial direction of the substrate 32, such as an etching treatment.

Incidentally, in the present embodiment, even when the diameter of the substrate 32 gradually increases from 10 inches (e.g., about 254 mm) to 12 inches (e.g., about 305 mm), for example, a ring-shaped plasma having a recessed center portion may be generated so as to effect a uniform plasma processing in the radial direction, but the ring-shaped cavity resonator need not always be used, as will be described hereinafter.

Figure 15:
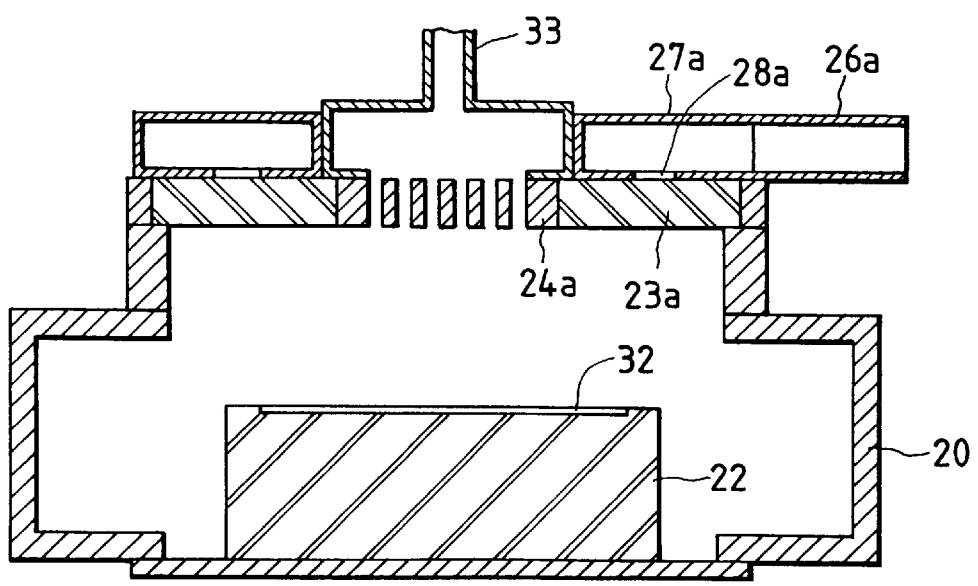
FIG. 15 is a vertical cross section showing a microwave dry-etching apparatus according to a fourth embodiment of the plasma processing apparatus of the present invention.

Next, a fourth embodiment of the present invention will be described with reference to FIG. 15. The same reference numerals are used in FIG. 15 as those of FIG. 11 to designate the common members, and their description will be omitted. The difference of FIG. 15 from the aforementioned third embodiment resides in that a cavity resonator which is low in height is used, in that no static magnetic field generator is provided and in that a high-frequency power source is not used. The microwaves of a frequency of 2.45 GHz, as radiated from the not-shown microwave source, such as a magnetron, are introduced through an isolator (not shown) and a matching device (not shown) into the ring-shaped cavity resonator 27 by the square waveguide 26a. The cavity resonator 27 is equipped in its bottom with the slot antenna holes 28a for feeding the microwaves to the plasma discharge tube 21 through the ring-shaped microwave introduction window 23. The ring-shaped cavity resonator 27 and the microwave introduction window 23 are equipped at their center with a gas supplier 24a which is connected to the gas feed pipe 33. The face of the gas supplier 24a, confronting the plasma discharge tube 21, is provided with a plurality of gas feed holes for feeding one or more kinds of processing gases at predetermined flow rates to the inside of the plasma discharge tube 21.

Figure 16:
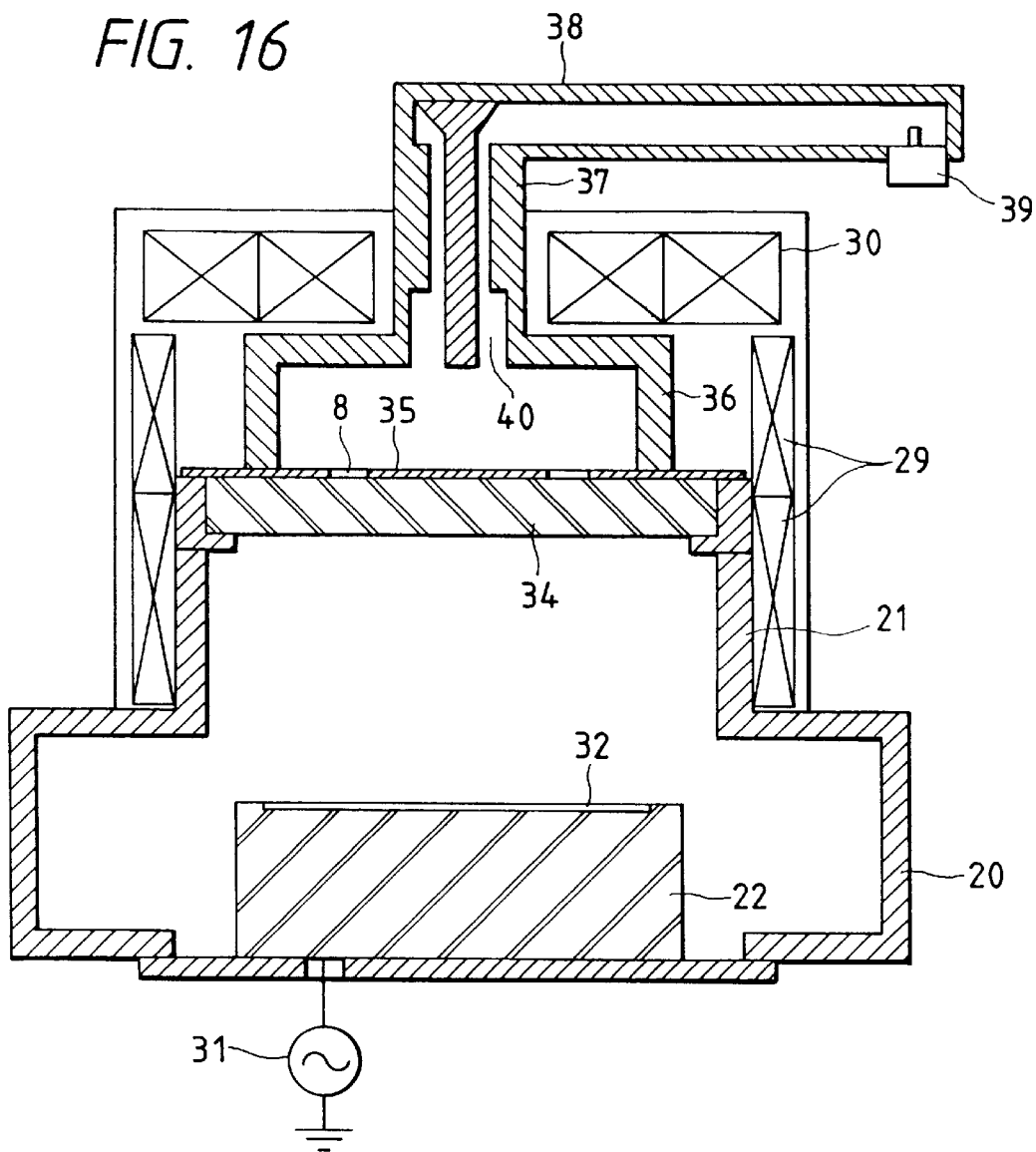
FIG. 16 is a vertical cross section showing a microwave dry-etching apparatus according to a fifth embodiment of the plasma processing apparatus of the present invention.

Next, a fifth embodiment of the present invention will be described with reference to FIGS. 16 and 17. The same reference numerals are used in FIGS. 16 and 17 as those of FIG. 11 to designate the common members, and their description will be omitted. The difference of FIGS. 16 and 17 from the aforementioned third embodiment resides in that a microwave solid circuit is used for transmitting the microwaves and in that the slot antenna plate of FIG. 1 is used. The microwaves, radiated from the microwave source 39, are transmitted through an isolator (not-shown) and a matching device to a coaxial line 37 by the rectangular waveguide tube. The coaxial waveguide converter 38 can transmit the microwave power with little power loss from the rectangular waveguide to the coaxial line 37. The coaxial line 37 is provided at its leading end with a matching chamber 40 for transmitting the microwave power efficiently into the cavity resonator 36 while preventing the reflections of the microwave power, as might otherwise be caused at the boundary between a cavity resonator 36 and the coaxial line 37.

Figure 17:
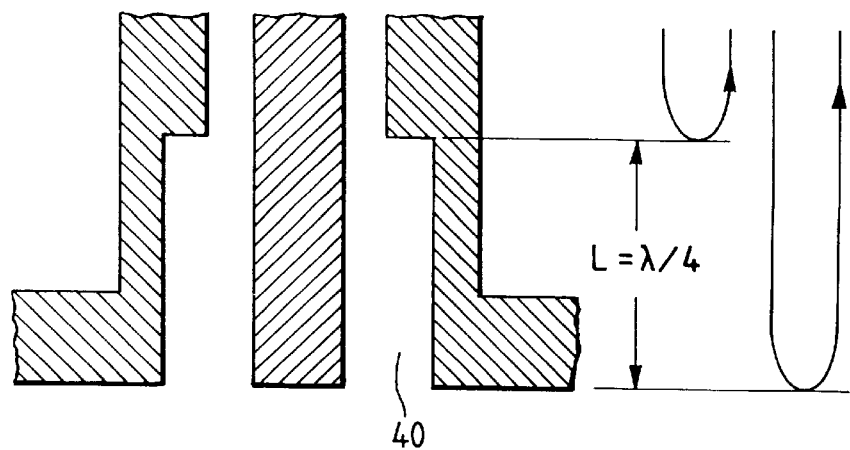
FIG. 17 is a vertical cross section showing the detail of the matching chamber in the apparatus of FIG. 16.

When a reflected wave is to be synthesized by setting the height L of the matching chamber 40 to one quarter of the wavelength p of the microwaves, as shown in FIG. 17, it is offset (or canceled) by the shift of the phase of one half so that the reflection of the microwave power can be suppressed. In other words, the matching chamber 40 may be given an impedance matching action by inserting a line having a different impedance, and need not be limited to the construction of FIG. 16.

Incidentally, the power of the microwaves (or electromagnetic waves) is partially reflected by the portion, if any, where the constant or boundary of the medium discontinuously changes. If the waveguide path is connected so as to excite the cavity resonator 36, reflections occur in the connection plane to exert adverse effects upon the efficient transmission of the microwave power into the plasma discharge tube 21. By providing the matching chamber 40 in the connection portion to optimize its diameter and height, thereby to cancel the reflected waves, the microwave power can be efficiently transmitted in its entirety into the plasma discharge tube 21.

Thereby, the microwave power can be transmitted with a low power loss from the square waveguide tube through the coaxial waveguide tube transformer 38 to the coaxial line portion 37 and efficiently into the cavity resonator 36, while preventing, due to the matching chamber 40, its reflection, which might otherwise be caused at the boundary between the cavity resonator 36 and the coaxial portion 37, so that the resonance can be effected in the circular $TM_{011}$ mode, in which the electromagnetic field is not changed in the angular direction (i.e., the direction q) with respect to the cavity resonator 36.

The cavity resonator 36 is constructed to have such a size as will resonate in the circular $TM_{011}$ mode, in this case. This cavity resonator 36 is made of a metal having a high conductivity, such as aluminum or copper, to prevent loss in the microwave power. The cavity resonator 36 is provided at the side of the microwave introduction window 34 with a slot antenna plate 35 for radiating the microwaves through the microwave introduction window 34 into the plasma discharge tube 21. The slot antenna plate 35 has slot antenna holes 8 as shown in FIG. 3. The material for the microwave introduction window 34 is exemplified by quartz or alumina ceramics which exhibit a low loss to the microwaves so as to exert no adverse influence upon the plasma processing.

The processing chamber is covered with a quartz cover so that it may not be invaded by a foreign substance. As a result, a ring-shaped microwave electromagnetic field is radiated from the slot antenna hole 8, which is formed in the bottom of the cavity resonator 36, through the microwave introduction window 34 into the plasma discharge tube 21, and the electron cyclotron resonance phenomenon is caused by the static magnetic field $H_s$ produced by the static magnetic field generators 29 and 30 thereby to generate a ring-shaped plasma having a recessed center. The high-frequency power produced by the high-frequency power source 31 is supplied to the substrate electrode so that the substrate 32 is subjected to the plasma processing or the etching treatment.

The circular $TM_{011}$ mode is advantageous for radiating the microwaves homogeneously in the angular direction because the electromagnetic field does not change in the angular direction (i.e., the direction q). In order to excite the circular $TM_{011}$ mode, it is necessary to use a waveguide path which is so connected that an electromagnetic field similar to the circular $TM_{011}$ mode is established in the connection plane. In the present embodiment, the coaxial line 37 is connected to the center of the cavity resonator 36 so that a similar electromagnetic field can be established. As a result, the microwaves can be excited in the circular $TM_{011}$ mode in which the electromagnetic field will not change in the angular direction (i.e., the direction q) with respect to the cavity resonator 36.

The slot antenna plate 7 is provided on the bottom of the cavity resonator, 36. In the bottom of the cavity resonator 36 in the circular $TM_{011}$ mode, there flows a surface current 81 (as indicated by a vector J) radially from the center axis. If the angle θ between an outward unit vector 82 (as indicated by a vector $n_s$) in the longitudinal direction of slot antennas hole 8, as shown in FIG. 3, and the radial direction is adjusted, it is possible to control the magnitude of the surface current to be shielded by the slot antenna hole 8, and the direction of the electric field of the microwaves to be radiated into the plasma discharge tube 21 can be controlled. In the case of the slot antenna of FIG. 3, when the angle θ is near 90 degrees, the ratio of the electric field component in the radial direction increases. When the angle θ is near 0 degrees, the ratio of the electric field component in the axial direction increases. It is also considered that the intensity of the electromagnetic field to be radiated is proportional to the magnitude of the current to be shielded by the slot antenna hole 8. It follows that the intensity of the electromagnetic field to be radiated is proportional to the magnitude of the vector product of $n_s \times J$ of the vectors $n_s$ and J. On the other hand, the surface current $J_p$ to be induced in the slot antenna plate 35 by the slot antenna hole 8 is perpendicular to the longitudinal direction of the slot antenna hole 8. If the slot antenna hole (i.e., the coupling holes) 8 is arranged, as shown in FIG. 3, the surface current $J_p$ has a component (in the $TE_{01}$ mode) to flow in the angular direction (i.e., the direction q) of the slot antenna plate 35 so that the intensity distribution of the electric field of the microwaves, as distributed in a ring shape, can be achieved. By making the angle θ, more specifically, the microwave electromagnetic field in the $TE_{01}$ mode and the microwave electromagnetic field in the $TM_{01}$ mode are emitted in the synthesized form, as illustrated in FIG. 4, from the slot antenna hole 8 through the microwave introduction window 34 into the plasma discharge tube 21. Incidentally, the microwave electromagnetic field (i.e., the ring-shaped microwave electromagnetic field) in the $TE_{01}$ mode establishes a ring-shaped microwave power distribution having a recessed center to generate the ring-shaped plasma. On the other hand, the microwave electromagnetic field in the $TM_{01}$ mode establishes a microwave power distribution having a recessed center.

Thanks to the angle θ, as has been described hereinbefore, the ring-shaped microwave electromagnetic field (i.e., the microwave electromagnetic field in the $TE_{01}$ mode) is radiated from the slot antenna hole 8 through the microwave introduction window 34 into the plasma discharge tube 21 so that a ring-shaped microwave power distribution having a recessed center is established to generate the ring-shaped plasma. Even if the diameter D of the substrate 32 to be treated is 10 inches (i.e., about 254 mm), 12 inches (i.e., about 305 mm) or more, so that the plasma disappears on the processing chamber wall, a homogeneous plasma processing can be realized in the radial direction of the substrate 32.

By thus adjusting the angle θ of the aforementioned slot antenna hole 8, the extent of the aforementioned ring-shaped field intensity distribution can be adjusted to control the homogeneity of the plasma. This method of constructing the slot antenna is not unique to the present embodiment but can be likewise applied to the case in which the cavity resonator of the third or fourth embodiment is used.

According to the present embodiment, there can be achieved an effect that a substrate to be treated, as large as 10 inches or more, can be subjected to a plasma processing, such as a homogeneous etching treatment.

According to the present embodiment, moreover, the power loss in the microwave solid circuit portion of the plasma processing apparatus using microwaves can be suppressed to provide an effect for making effective use of the microwave power. Thanks to the suppression of the power loss, still moreover, there can be achieved an effect for suppressing the unnecessary heating of the microwave solid circuit portion.

A sixth embodiment of the present invention will be described with reference to FIGS. 18 to 21.

Figure 18:
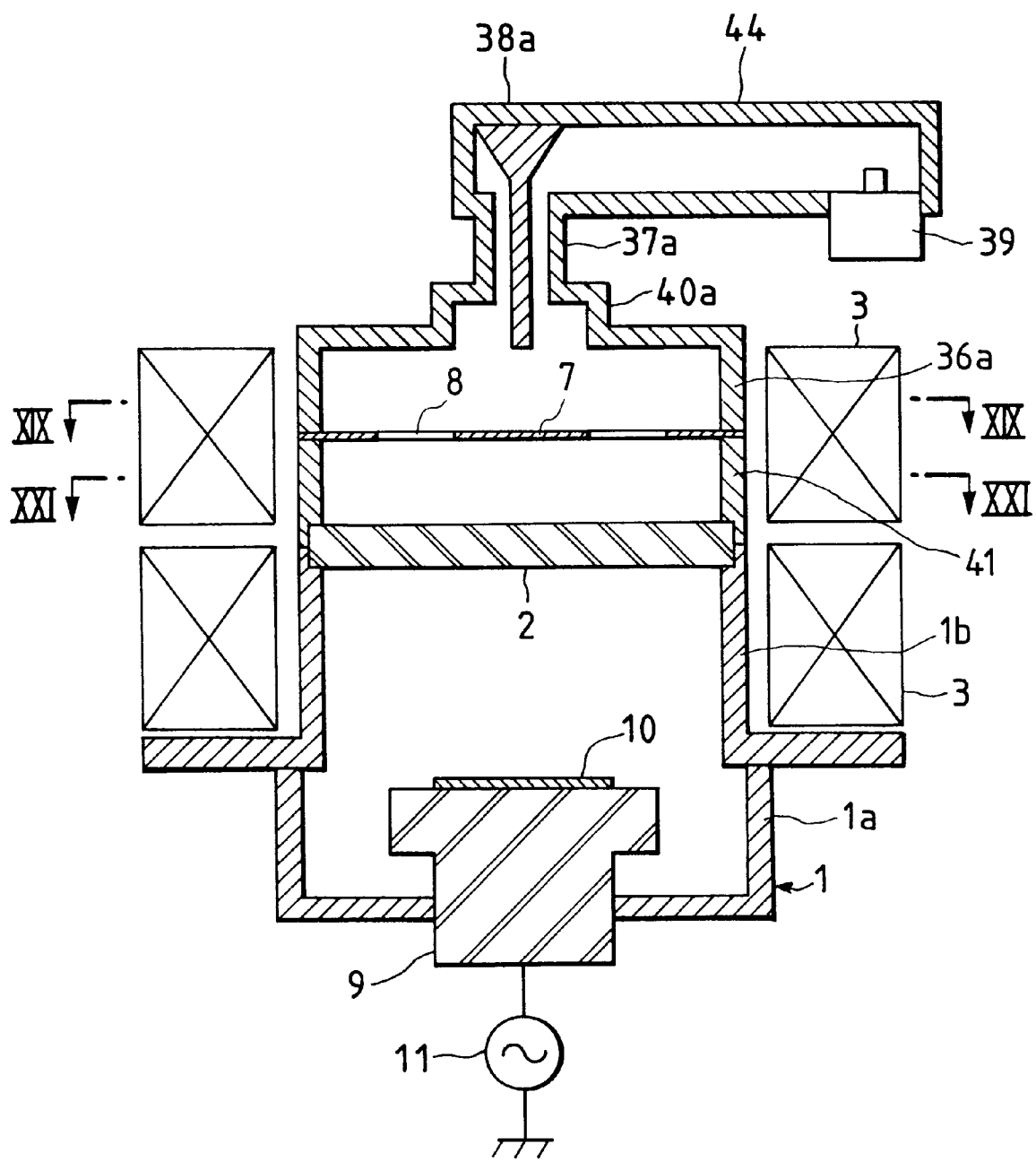
FIG. 18 is a vertical cross section showing a microwave dry-etching apparatus according to a sixth embodiment of the plasma processing apparatus of the present invention.

FIG. 18 shows a magnetic field microwave dry etching apparatus according to one embodiment of the plasma processing apparatus of the present invention. The inside of a processing chamber 1, as defined by a container 1a, a discharge tube 1b and a quartz window 2, is evacuated by a (not-shown) evacuator. After this, an etching gas is introduced by a (not-shown) gas feeder into the processing chamber 1 to adjust it to a desired pressure. On the other hand, the processing chamber 1 is in the region of a magnetic field which is generated by a coil 3. The microwaves of 2.45 GHz, as oscillated from a magnetron 39, propagate in a rectangular waveguide 44 and further through a coaxial waveguide converter 38a into a coaxial waveguide 37a. The microwaves having propagated in the coaxial waveguide 37a are introduced through a matching chamber 40a into a cavity resonator 36a. In the bottom portion of the cavity resonator 36a, there is disposed a slot antenna 7. The microwaves, as radiated from this slot antenna 7, propagate in a mode filter 41 and are then introduced through the quartz window 2 into the processing chamber 1. A wafer 10, as arranged on a sample bed 9, is etched with the plasma which is generated by the microwaves. In order to control the etched shape of the wafer 10, on the other hand, a high-frequency power source 11 is connected with the sample bed 9 through a matching device so that it can apply a high-frequency voltage.

Figure 19:
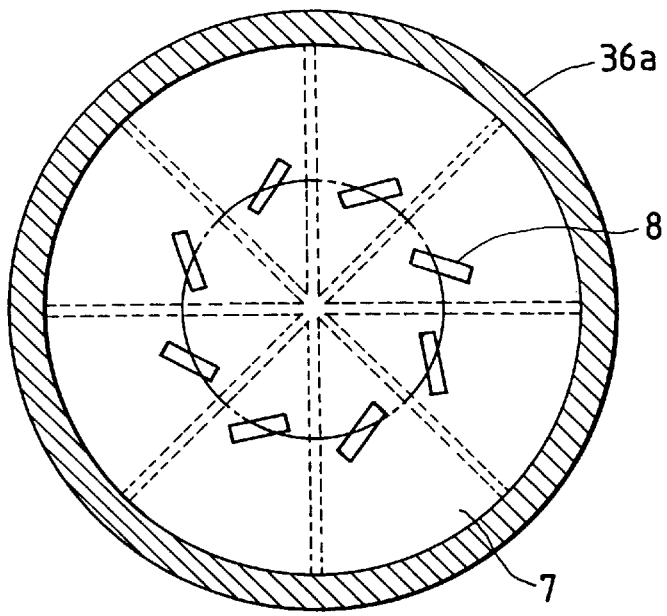
FIG. 19 is a section taken in the direction XIX—XIX of FIG. 18.
Figure 20:
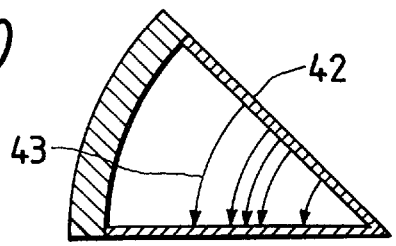
FIG. 20 is a view showing the field strength distribution of the microwaves of a fundamental mode of a waveguide having a triangular section.
Figure 21:
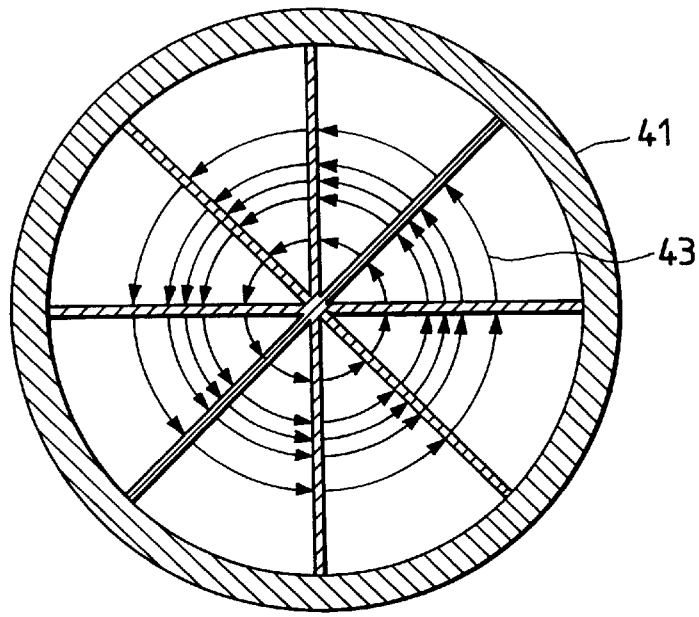
FIG. 21 is a section taken in the direction XXI—XXI of FIG. 18.

FIG. 19 is a view of section XIX—XIX, as taken in the direction of the arrow, of the mode filter 41 of FIG. 18. A slot antenna hole 8 is arranged in a ring direction which is inclined at a constant angle with respect to the radial direction. The cavity resonator 36a is designed to resonate in a $TM_{011}$ mode. As a result, a $TM_{01}$ mode and a $TE_{01}$ mode, mixed, are introduced from the aforementioned so-called "slot antenna" into the mode filter 41. This mode filter 41 is constructed to include a plurality of waveguides 42 having a generally triangular section. As shown in FIG. 20, each waveguide 42 having a triangular section is sized to propagate only microwaves in a single mode. FIG. 20 shows the strength distribution of the electric field 43 of the microwaves to be transmitted. As a result, the overall field strength distribution of the waveguides 42 having the triangular section is generally identical to the $TE_{01}$ mode having the ring-shaped field strength distribution, as shown in FIG. 21. By thus providing the mode filter 41 of the $TE_{01}$ mode between the slot antenna plate 7 and the microwave introducing window 2, only the microwaves in a $TE_{01}$ (n: an arbitrary positive integer) having a ring-shaped strength distribution can be introduced into the processing chamber 1. Thus, a generally ring-shaped plasma distribution is established on the ECR face or the main plasma generating region so that a homogeneous plasma distribution can be achieved on the wafer 10 thereby to provide an effect that a homogeneous plasma processing can be achieved.

In another form of the mode filter, an inner conductor is provided at the center portion of the mode filter 41. This mode filter is formed to have a donut-shaped (or ring-shaped) section. The highest field strength is generally located at an intermediate position between the external diameter φC an inner conductor 18 and the internal diameter φD of the mode filter 41. By selecting the diameters φC and φD suitably, therefore, it is possible to alter the position where the field strength of the microwaves to be introduced into the processing chamber 1 takes a maximum. As a result, the ring diameter of the ring-shaped plasma generating region, as formed on the aforementioned ECR face, can be controlled to control the plasma distribution on the wafer 10 thereby to provide an effect that the homogeneity of the plasma processing of the wafer 10 can be controlled.

Figure 22:
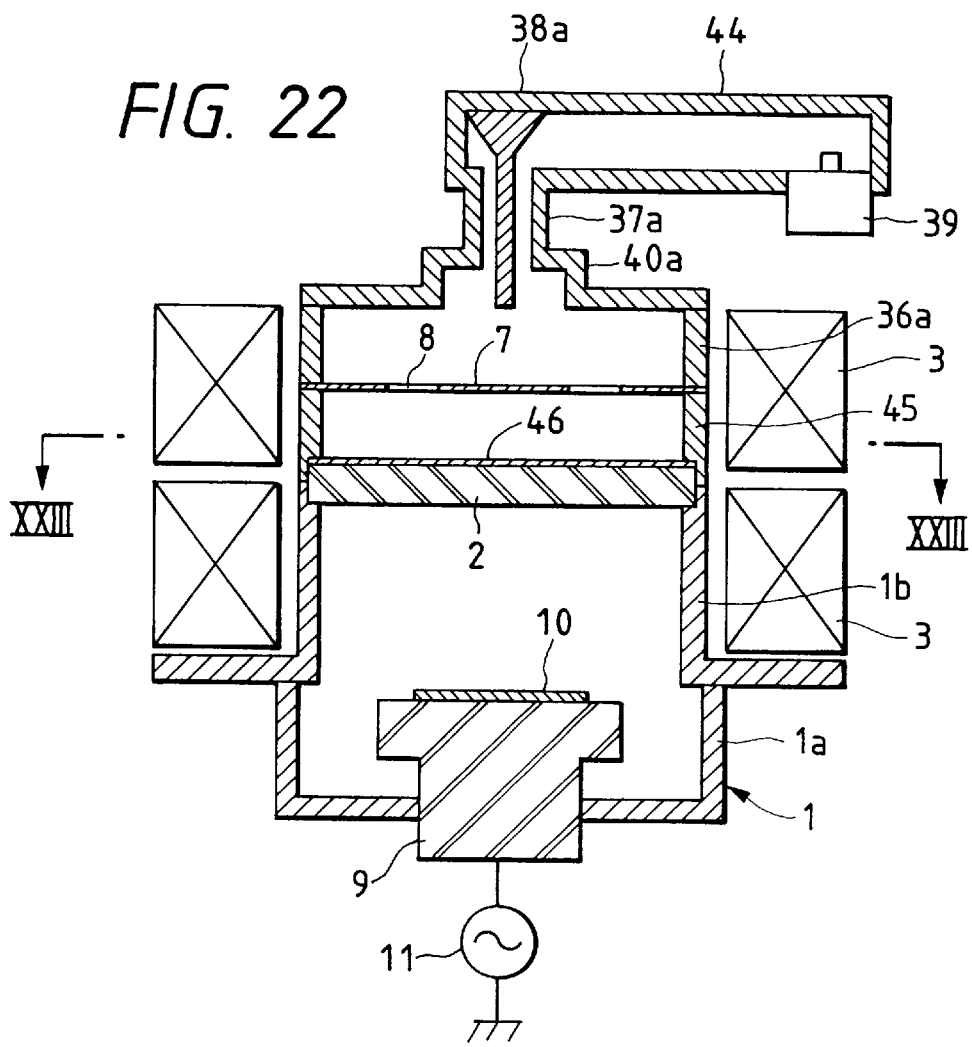
FIG. 22 is a vertical cross section showing a microwave dry-etching apparatus according to a seventh embodiment of the plasma processing apparatus of the present invention.
Figure 23:
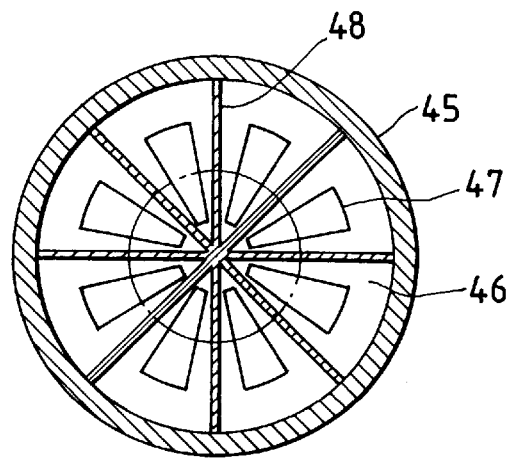
FIG. 23 is a section taken in the direction XXIII—XXIII of FIG. 22.

A seventh embodiment will be described with reference to FIGS. 22 and 23. As shown in FIG. 22, the present embodiment is modified from the sixth embodiment such that the mode filter 41 is replaced by a $TE_{012}$ cavity resonator 45. Below this $TE_{011}$ resonator 45, moreover, there is arranged a plate 46 having radial slot antenna holes 47, as shown in FIG. 23. The microwaves of $TM_{01}$ mode and $TE_{01}$ mode, as radiated from aforementioned sloped slot antenna 7, are passed through the $TE_{012}$ cavity resonator 45 so that only the microwaves of $TE_{0n}$ (n: an arbitrary positive integer) mode are introduced through the slot antenna hole 47 into the processing chamber. In the present embodiment, therefore, a homogeneous plasma distribution can also be achieved on the wafer 10 as in the first embodiment thereby to provide an effect that the wafer 10 can be homogeneously processed with the plasma. As shown in FIG. 23, moreover, the inside of the cavity resonator 45 may be partitioned by radial conductor plates 48 to have a structure similar to that of the mode filter 11 shown in FIG. 21. As a result, only purer microwaves of the $TE_{0n}$ (n: an arbitrary positive integer) are introduced through the slot antenna holes 47 into the processing chamber 1 thereby to provide an effect that the wafer 10 can be highly homogeneously processed with the plasma.

According to the present embodiment, the mode filter for the $TE_{01}$ mode is interposed between the slot antenna and the microwave introduction window so that the microwaves of the $TE_{0n}$ (n: an arbitrary positive integer) mode having a ring-shaped field strength distribution can be introduced into the processing chamber. As a result, a generally ring-shaped plasma distribution can be achieved on the ECR plane or the main plasma generating region so that a homogeneous plasma distribution can be achieved on the wafer thereby to provide the effect of homogeneous plasma processing.

The embodiments thus far described should not be limited only to an etching apparatus, but can be applied to another plasma processing apparatus, such as a CVD (Chemical Vapor Deposition) apparatus or an ashing apparatus by changing the processing gas to be introduced.

What is claimed is:

1. A plasma processing apparatus comprising:

a microwave source;

a microwave waveguide for transmitting microwaves radiated from said microwave source;

a ring-shaped cavity resonator for resonating the microwaves transmitted by said microwave waveguide;

a processing chamber including a sample stand for placing thereon a substrate to be treated; and microwave electromagnetic field radiating means for radiating a microwave electromagnetic field from said ring-shaped cavity resonator through a microwave introduction window into said precessing chamber, to generate a ring-shaped plasma in a region opposed to said substrate.

2. A plasma processing apparatus according to claim 1, wherein said microwave electromagnetic field is synthesized from both $TE_{0n}$ and $TM_{0m}$ modes, where n and m are each positive integers of at least 1.

3. A plasma processing apparatus according to claim 2, where n and m are each 1.

4. A plasma processing apparatus according to claim 1, wherein said ring-shaped cavity resonator from which the microwave electromagnetic field is irradiated includes a slot antenna plate forming a bottom of said ring-shaped cavity resonator, said slot antenna plate having a plurality of slot antenna holes therein, each of said slot antenna holes being elongated and extending at an angle which is not parallel with and not perpendicular to a surface current flowing on said slot antenna plate.

5. A plasma processing apparatus according to claim 4, wherein said slot antenna plate is a circular plate and said slot antenna holes are arranged in a ring-shaped pattern therein.

6. A plasma processing apparatus according to claim 5, wherein the microwave electromagnetic field is radiated radially and circumferentially from said slot antenna plate.

7. A plasma processing apparatus according to claim 5, wherein microwaves are irradiated from said slot antenna plate which are mixed both in $TE_{0n}$ and $TM_{0m}$ modes, where n and m are each positive integers of at least 1, and an intersecting angle between the extension direction of each of said slot antennas and the surface current flowing on said slot antenna plate is selected in accordance with a desired ratio between the mode $TE_{0n}$ and the mode $TM_{0m}$.

8. A plasma processing apparatus according to claim 7, where n and m are each 1.

* * * * *